United States Patent
Sengupta et al.

(10) Patent No.: US 8,421,541 B2
(45) Date of Patent: Apr. 16, 2013

(54) RF SINGLE-ENDED TO DIFFERENTIAL CONVERTER

(75) Inventors: Susanta Sengupta, Austin, TX (US); Kenneth C. Barnett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 722 days.

(21) Appl. No.: 12/606,003

(22) Filed: Oct. 26, 2009

(65) Prior Publication Data

US 2010/0329158 A1 Dec. 30, 2010

Related U.S. Application Data

(60) Provisional application No. 61/221,048, filed on Jun. 27, 2009.

(51) Int. Cl.
*H03F 3/04* (2006.01)

(52) U.S. Cl.
USPC .......................................... 330/301; 327/359

(58) Field of Classification Search .......... 330/252–261, 330/301; 455/24
See application file for complete search history.

(56) References Cited

U.S. PATENT DOCUMENTS

| | | | |
|---|---|---|---|
| 5,343,163 A * | 8/1994 | Linder et al. | 330/252 |
| 2002/0168954 A1 | 11/2002 | Jones | |
| 2002/0175763 A1 | 11/2002 | Dasgupta et al. | |
| 2003/0179041 A1 | 9/2003 | Weldon | |
| 2005/0174167 A1 | 8/2005 | Vilander et al. | |
| 2006/0181349 A1 | 8/2006 | Koh et al. | |
| 2007/0205829 A1 | 9/2007 | Kao et al. | |
| 2008/0036536 A1 | 2/2008 | Khorramabadi | |
| 2008/0122538 A1 | 5/2008 | Park et al. | |
| 2008/0186096 A1 | 8/2008 | Johnson et al. | |
| 2008/0231362 A1 | 9/2008 | Muthali et al. | |
| 2009/0219094 A1 | 9/2009 | Kim et al. | |

FOREIGN PATENT DOCUMENTS

| | | |
|---|---|---|
| EP | 0121027 | 10/1984 |
| EP | 1806839 | 7/2007 |
| WO | WO0074233 A1 | 12/2000 |
| WO | WO02103898 | 12/2002 |
| WO | WO2004086608 A1 | 10/2004 |
| WO | WO2008115907 | 9/2008 |

OTHER PUBLICATIONS

International Search Report and Written Opinion—PCT/US2010/040246, ISA/EPO—May 2, 2011.
Partial International Search Report—PCT/US2010/040246—International Search Authority—European Patent Office—Sep. 29, 2010.

* cited by examiner

*Primary Examiner* — Robert Pascal
*Assistant Examiner* — Khiem Nguyen
(74) *Attorney, Agent, or Firm* — Kevin T. Cheatham

(57) ABSTRACT

Techniques for designing a highly differential single-ended-to-differential converter for use in, e.g., communications receivers. In an exemplary embodiment, an auxiliary current path including cascomp transistors is coupled to a main current path including input transistors and cascode transistors. The transistors are biased such that inter-modulation products generated by the auxiliary current path cancel out inter-modulation products generated by the main current path. In another exemplary embodiment, current source transistors for the main current path are adaptively biased depending on the level of the input signal received. In an exemplary embodiment, the techniques may be applied to designing a converter for interfacing a single-ended low-noise amplifier (LNA) output voltage with a differential mixer input in a communications receiver.

24 Claims, 5 Drawing Sheets

RF SINGLE-ENDED TO DIFFERENTIAL CONVERTER

CLAIM OF PRIORITY UNDER 35 U.S.C. §119

The present Application for Patent claims priority to U.S. Provisional Application Ser. No. 61/221,048, entitled, "RF Single-Ended to Differential Converter," filed Jun. 27, 2009, assigned to the assignee of the present disclosure, the contents of which are hereby incorporated by reference in their entirety.

RELATED APPLICATIONS

This application is related to U.S. patent application Ser. No. 12/126,189, entitled, "Amplifier with Improved Linearization," filed May 23, 2008, and to U.S. patent application Ser. No. 11/761,947, entitled, "Linear Transconductor for RF Communications," filed Jun. 12, 2007, both assigned to the assignee of the present disclosure, the contents of which are hereby incorporated by reference in their entirety.

BACKGROUND

1. Field

The disclosure relates to electronic circuit design, and in particular, to techniques for designing highly linear single-ended-to-differential converters.

2. Background

Single-ended-to-differential converters are employed in applications where a single-ended signal, such as a voltage referenced to ground, is to be converted to a differential signal, such as a differential voltage between two terminals. One example application is in certain communications receivers, wherein a single-ended output voltage of a low-noise amplifier is converted to a differential voltage which may support an input current for a mixer. In some applications, it is important for a single-ended-to-differential converter to exhibit good linearity, as measured by, e.g., input-referred third-order intercept point (IIP3).

It would be desirable to provide techniques for designing highly linear single-ended-to-differential converters for use in, e.g., communications receivers.

SUMMARY

An aspect of the present disclosure provides an apparatus comprising a single-ended-to-differential converter comprising: first and second input transistors, the gate of the first input transistor coupled to a single-ended voltage, the gate of the second input transistor coupled to an AC ground voltage, the first and second input transistors being biased by a main current; first and second cascode transistors coupled to the drains of the first and second input transistors, respectively; loading elements coupled to the drains of the first and second cascode transistors, the drains of the cascode transistors being coupled to a differential output voltage; and first and second cascomp transistors, the drains of the first and second cascomp transistors coupled to the drains of the second and first cascode transistors, respectively, the gate of the first cascomp transistor coupled to the single-ended voltage, the gate of the second cascomp transistor coupled to an AC ground voltage, the cascomp transistors being biased by an auxiliary current.

Another aspect of the present disclosure provides coupling a single-ended voltage to a main single-ended-to-differential converter comprising first and second input transistors and first and second cascode transistors, the gate of the first input transistor coupled to a single-ended voltage, the gate of the second input transistor coupled to an AC ground voltage, the sources of the first and second input transistors being biased by a main current, the main single-ended-to-differential converter further comprising loading elements coupled to the drains of the first and second cascode transistors, the drains of the cascode transistors being coupled to a differential output voltage; and coupling the drain voltages of the second and first cascode transistors to drains of first and second cascomp transistors, respectively, the gate of the first cascomp transistor coupled to the single-ended voltage, the gate of the second cascomp transistor coupled to an AC ground voltage, the sources of the cascomp transistors being biased by an auxiliary current.

Yet another aspect of the present disclosure provides an apparatus comprising a single-ended-to-differential converter comprising: means for converting a single-ended voltage to a differential voltage using a main path; and means for cancelling an inter-modulation product generated by the main path with an inter-modulation product generated by an auxiliary path.

Yet another aspect of the present disclosure provides a device for wireless communications, the device comprising at least one digital-to-analog converter (DAC) for converting a digital TX signal to an analog TX signal, at least one baseband TX amplifier for amplifying the analog TX signal, a TX LO signal generator, an upconverter coupled to the TX LO signal generator and the at least one baseband TX amplifier, a TX filter coupled to the output of the upconverter, a power amplifier (PA) coupled to the TX filter, a duplexer coupled to the output of the power amplifier, a low-noise amplifier (LNA) coupled to the duplexer, a filter coupled to the LNA, a single-ended-to-differential converter coupled to the filter, an RX LO signal generator, a downconverter coupled to the RX LO signal generator and a differential output of the single-ended-to-differential converter, at least one low-pass filter coupled to the output of the downconverter, at least one analog-to-digital converter (ADC) for converting the output of the low-pass filter into a digital signal, the single-ended-to-differential converter comprising: first and second input transistors, the gate of the first input transistor coupled to a single-ended voltage, the gate of the second input transistor coupled to an AC ground voltage, the first and second input transistors being biased by a main current; first and second cascode transistors coupled to the drains of the first and second input transistors, respectively; loading elements coupled to the drains of the first and second cascode transistors, the drains of the cascode transistors being coupled to a differential output voltage; and first and second cascomp transistors, the drains of the first and second cascomp transistors coupled to the drains of the second and first cascode transistors, respectively, the gate of the first cascomp transistor coupled to the single-ended voltage, the gate of the second cascomp transistor coupled to an AC ground voltage, the cascomp transistors being biased by an auxiliary current.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
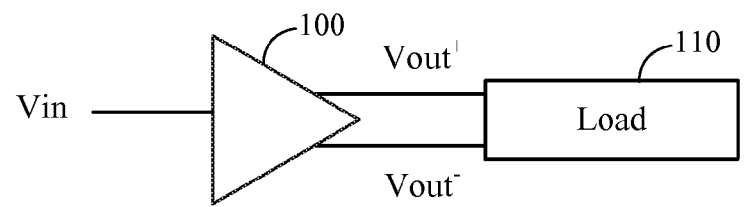
FIG. 1 illustrates a single-ended-to-differential converter according to the present disclosure.

FIG. 1 illustrates a single-ended-to-differential converter 100 according to the present disclosure. In FIG. 1, a single-ended input voltage Vin is provided to a converter 100, which generates a differential output voltage Vout=(Vout⁺−Vout⁻) that is ideally proportional to Vin. Vout is provided to a load 110. In an exemplary embodiment, the load 110 may present a low input impedance to the output of the converter 100, in which case the converter 100 may be designed to provide sufficient current drive to support the differential output voltage Vout.

Figure 2:
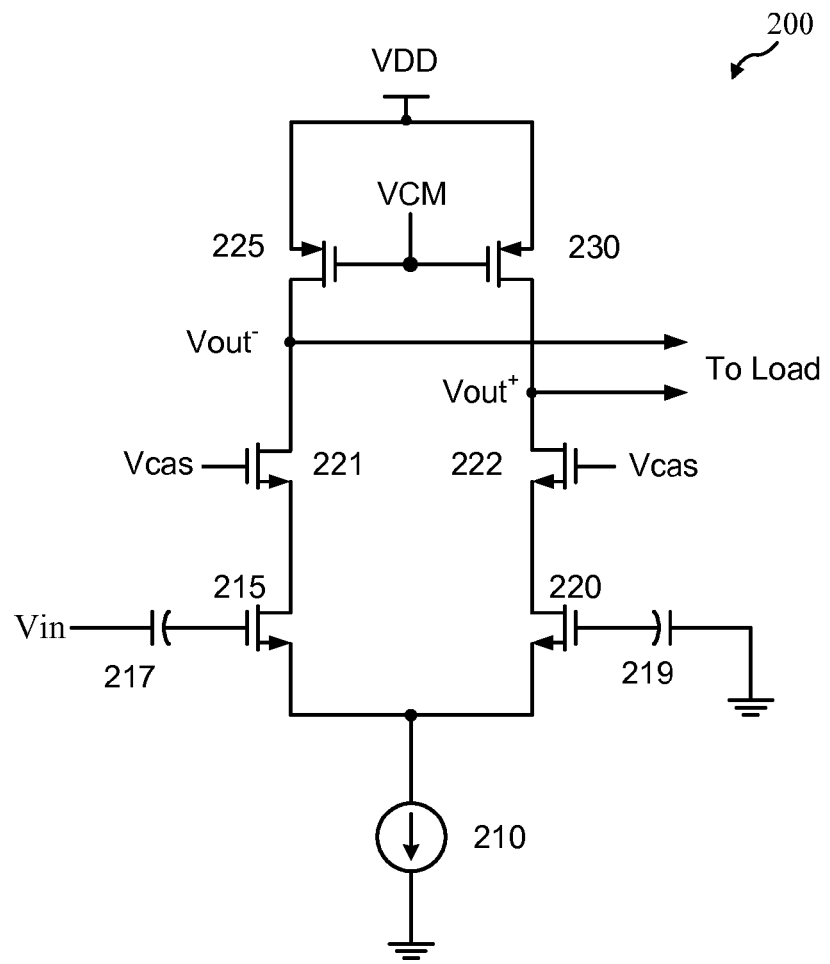
FIG. 2 illustrates a baseline implementation of a single-ended-to-differential converter.

FIG. 2 illustrates a baseline implementation 200 of a single-ended-to-differential converter 100. In the converter 200, transistors 215 and 220 form an input differential pair, with the gate of transistor 215 AC-coupled to the input voltage Vin via capacitor 217, and the gate of transistor 220 AC-coupled to ground via capacitor 219. Note for simplicity, the DC biasing details of transistors 215 and 220 have been omitted in FIG. 2. The sources of transistors 215 and 220 are coupled to each other, and further to a current source 210. The drains of transistors 215 and 220 are coupled to the output voltages Vout⁻ and Vout⁺ via cascode transistors 221 and 222, respectively. It will be appreciated that cascode transistors 221 and 222 advantageously improve the isolation of the differential output Vout from the input Vin, thus, e.g., extending the bandwidth over which the converter 200 may operate. Cascode transistors 221 and 222 are DC biased by a voltage Vcas.

In FIG. 2, the converter 200 further includes transistors 225 and 230 coupled to the output voltages Vout⁻ and Vout⁺, respectively. In the implementation shown, a bias voltage VCM may be provided to bias the transistors 225 and 230 so that the common-mode level of the voltages Vout⁻ and Vout⁺ are well-defined.

It will be appreciated that one figure of merit for the single-ended-to-differential converter 100 is the input-referred third-order intercept point (IIP3), which measures the linearity of the converter. In the converter implementation 200 shown in FIG. 2, the IIP3 may be limited by, e.g., third-order inter-modulation (IM3) products generated in the differential output voltage Vout at the drains of transistors 221 and 222. It would be desirable to provide techniques for improving the linearity of a single-ended-to-differential converter, thereby reducing IM3 products and increasing the IIP3.

Figure 3:
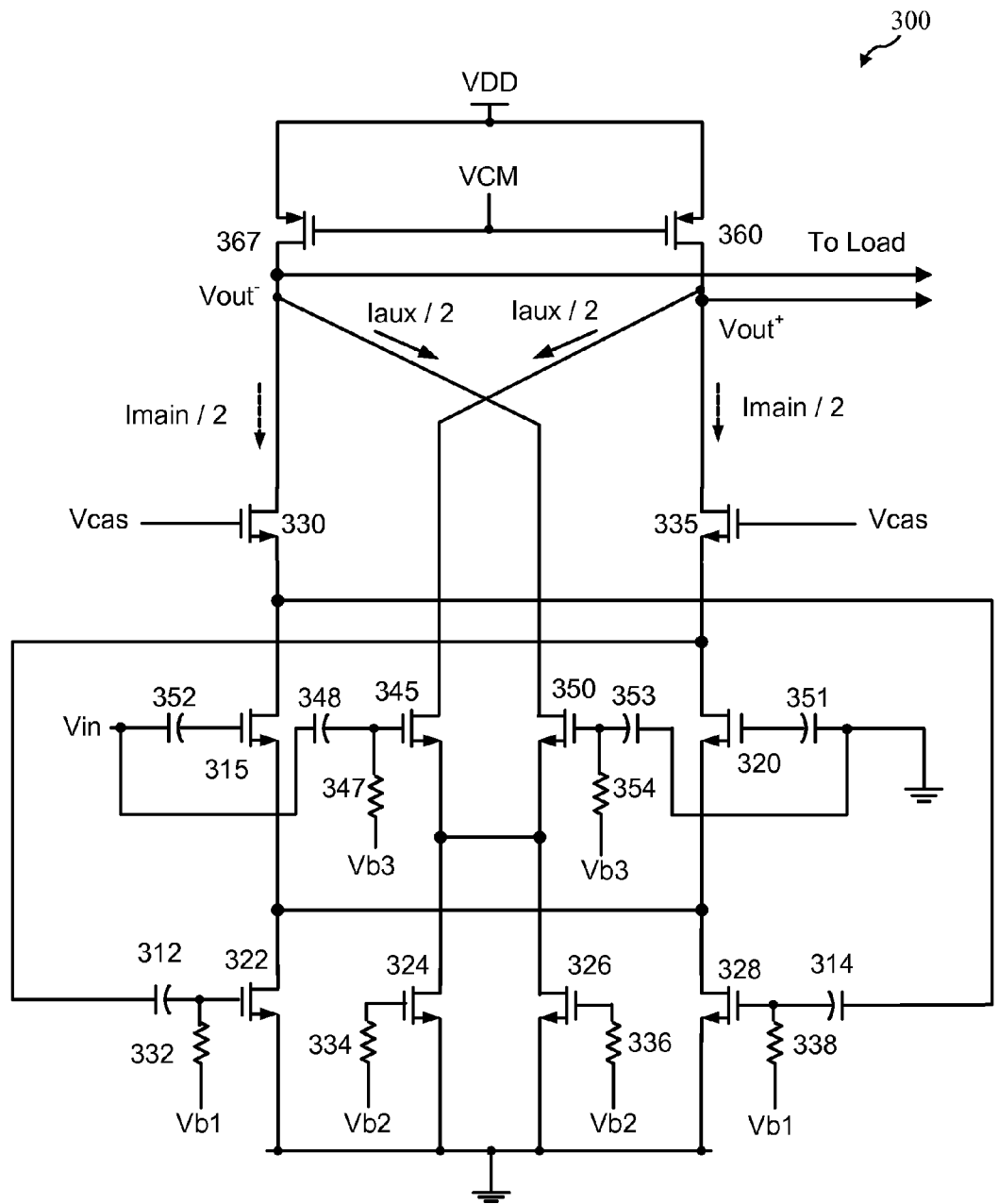
FIG. 3 illustrates an exemplary embodiment of a single-ended-to-differential converter according to the present disclosure.

FIG. 3 illustrates an exemplary embodiment 300 of a single-ended-to-differential converter 100 according to the present disclosure. In the converter 300, input transistors 315 and 320 form a differential input stage, with the gate of transistor 315 AC-coupled to the input voltage Vin via capacitor 352, and the gate of transistor 320 AC-coupled to ground via capacitor 351. Note for simplicity, the DC biasing details of transistors 315 and 320 have been omitted in FIG. 3. The drains of transistors 315 and 320 are coupled to the output voltages Vout⁻ and Vout⁺ via cascode transistors 330 and 335, respectively, which are further coupled to load transistors 367 and 360. Note in alternative exemplary embodiments, transistors 367 and 360 may be replaced by resistors or other load elements (not shown). The sources of transistors 315 and 320 are coupled to each other, and further to main current source transistors 322 and 328. The total quiescent bias current generated by transistors 322 and 328 is also denoted herein as the main current, or Imain. It will be appreciated that in the quiescent bias condition, Imain flows through a "main path" formed by transistors 315 and 330 supporting Imain/2, and transistors 320 and 335 also supporting Imain/2.

In an exemplary embodiment, the main current source transistors 322 and 328 may be adaptively biased to improve the linearity of the input transistors 315 and 320. In particular, the gates of transistors 322 and 328 are each DC biased by a voltage Vb1, and further cross-coupled to the drains of transistors 320 and 315, respectively, using AC coupling capacitors 312 and 314. It will be appreciated that the AC cross-coupling of signals to the gates of transistors 322 and 328 may advantageously adjust the bias current supplied to the input transistors 315 and 320 depending on the amplitude of Vin, thus helping to maintain the linearity of the converter 300.

In an exemplary embodiment, the gates of transistors 345 and 350 (also denoted herein as "cascomp transistors") are further AC-coupled to Vin and to AC ground, respectively, via capacitors 348 and 353. The drains of transistors 345 and 350 are coupled to the drains of transistors 335 and 330, respectively. The sources of transistors 345 and 350 are coupled to each other, and further to auxiliary current source transistors 324 and 326. The total current generated by transistors 324 and 326 is denoted herein as the auxiliary current, or Iaux. Iaux flows through an "auxiliary path" formed by transistors 345 and 350, wherein Iaux/2 flows through transistor 345 and Iaux/2 flows through transistor 350 under the quiescent bias condition. One of ordinary skill in the art will appreciate that transistors 324 and 326 may be alternatively implemented as a single transistor current source.

Note while capacitors 348 and 353 are shown as coupling the gates of transistors 345 and 350 to Vin and AC ground, respectively, it will be appreciated that the capacitors 348 and 353 may be alternatively coupled. For example, capacitors 348 and 353 may alternatively couple the gates of transistors 345 and 350 directly to the gates of transistors 315 and 320, respectively. Such alternative exemplary embodiments are contemplated to be within the scope of the present disclosure.

In an exemplary embodiment, transistors 345 and 350 are biased in weak inversion, with gate-to-source voltages (VGS) on the order of, e.g., 0.4 V, and threshold voltages VT on the order of, e.g., 0.55V. In an exemplary embodiment, transistors 315 and 320 are biased in moderate inversion, with VGS on the order of, e.g., 0.6 V, and VT on the order of 0.55V. In an exemplary embodiment, the supply voltage VDD may be 1.3V.

It will be appreciated from the circuit topology shown that the input signal to transistor 315 is provided with the same phase as the input signal to transistor 345, while the input signal to transistor 320 is provided with the same phase as the input signal to transistor 350. It will be appreciated that due to this configuration, the IM3 product generated by the main and auxiliary paths may be advantageously cancelled at the differential output. To avoid cancelling the desired signal, which would undesirably reduce the gain and increase the noise figure (NF) of the converter 300, the bias voltages may be chosen such that Imain>>Iaux. In an exemplary embodiment, Imain may be on the order of 10*Iaux.

In an exemplary embodiment, the current Iaux provided by transistors 324 and 326 may be further adjusted to achieve the desired level of cancellation of the third order non-linearity components. For example, the bias voltage Vb2 of transistors 324 and 326 may be adjusted to achieve the desired level of cancellation.

In an alternative exemplary embodiment (not shown), a single-ended-to-differential converter need not employ adaptive biasing of cross-coupling capacitors 312 and 314 in conjunction with the cascomp transistors 345 and 350 shown. Either of these features may be implemented separately from the other to perform single-ended to differential conversion. Such alternative exemplary embodiments are contemplated to be within the scope of the present disclosure.

In accordance with the techniques described hereinabove, highly linear circuitry for performing single-ended to differential conversion over a wide band of frequencies (e.g., 100 MHz-900 MHz) may be designed.

Figure 4:
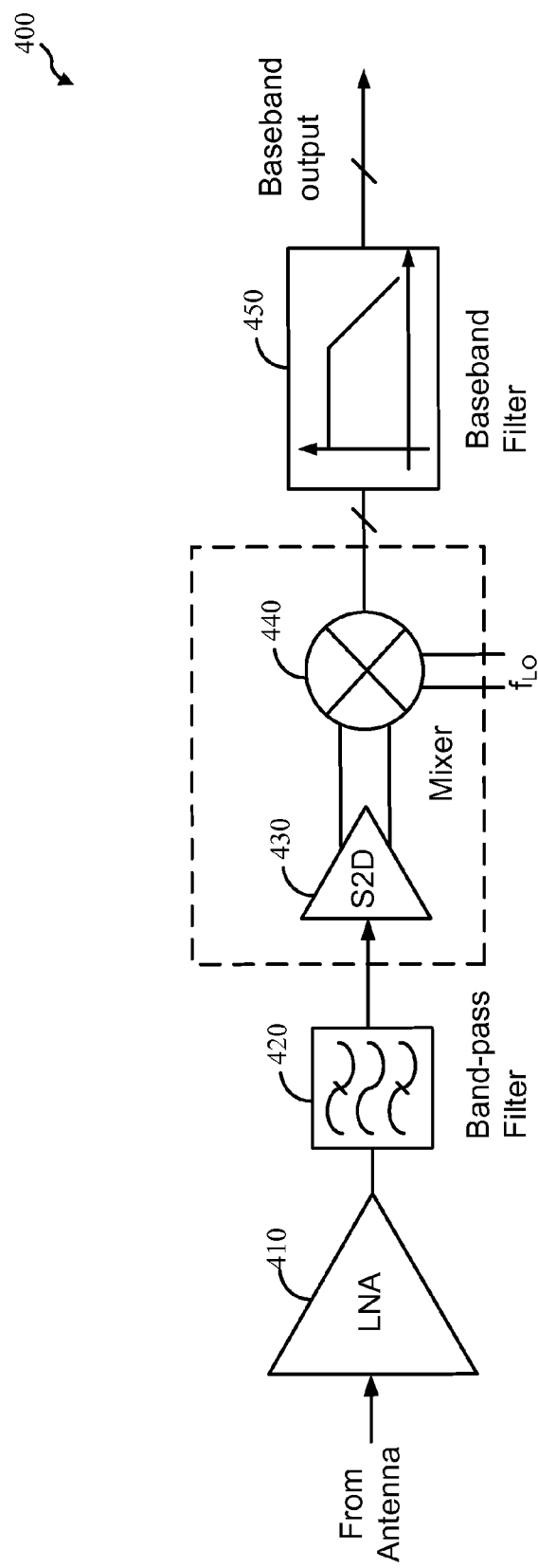
FIG. 4 illustrates an exemplary embodiment of a receiver in which the techniques of the present disclosure may be implemented.

FIG. 4 illustrates an exemplary embodiment of a receiver 400 in which the techniques of the present disclosure may be implemented. Note FIG. 4 is shown for illustrative purposes only, and is not meant to limit the application of the present disclosure to receivers.

In FIG. 4, a low-noise amplifier (LNA) 410 receives a radio-frequency (RF) signal from an antenna (not shown). The LNA 410 outputs an amplified version of the RF signal to a band-pass filter 420. The output of the band-pass filter 420 is coupled to a single-ended-to-differential converter (S2D) 430. In an exemplary embodiment, the single-ended-to-differential converter 430 may be designed using the techniques previously disclosed herein. The differential output of the single-ended-to-differential converter 430 is provided to a mixer 440, which mixes the differential signal with a differential local oscillator signal having a frequency $f_{LO}$. The input of the mixer 440 may present a low impedance to the output of the single-ended-to-differential converter 430. The output of the mixer 440 is coupled to a baseband filter 450 to generate a baseband output signal for further processing. Note the output of the mixer 440 and the baseband filter 450 may be single-ended or differential, depending on the specific architectures employed.

Figure 5:
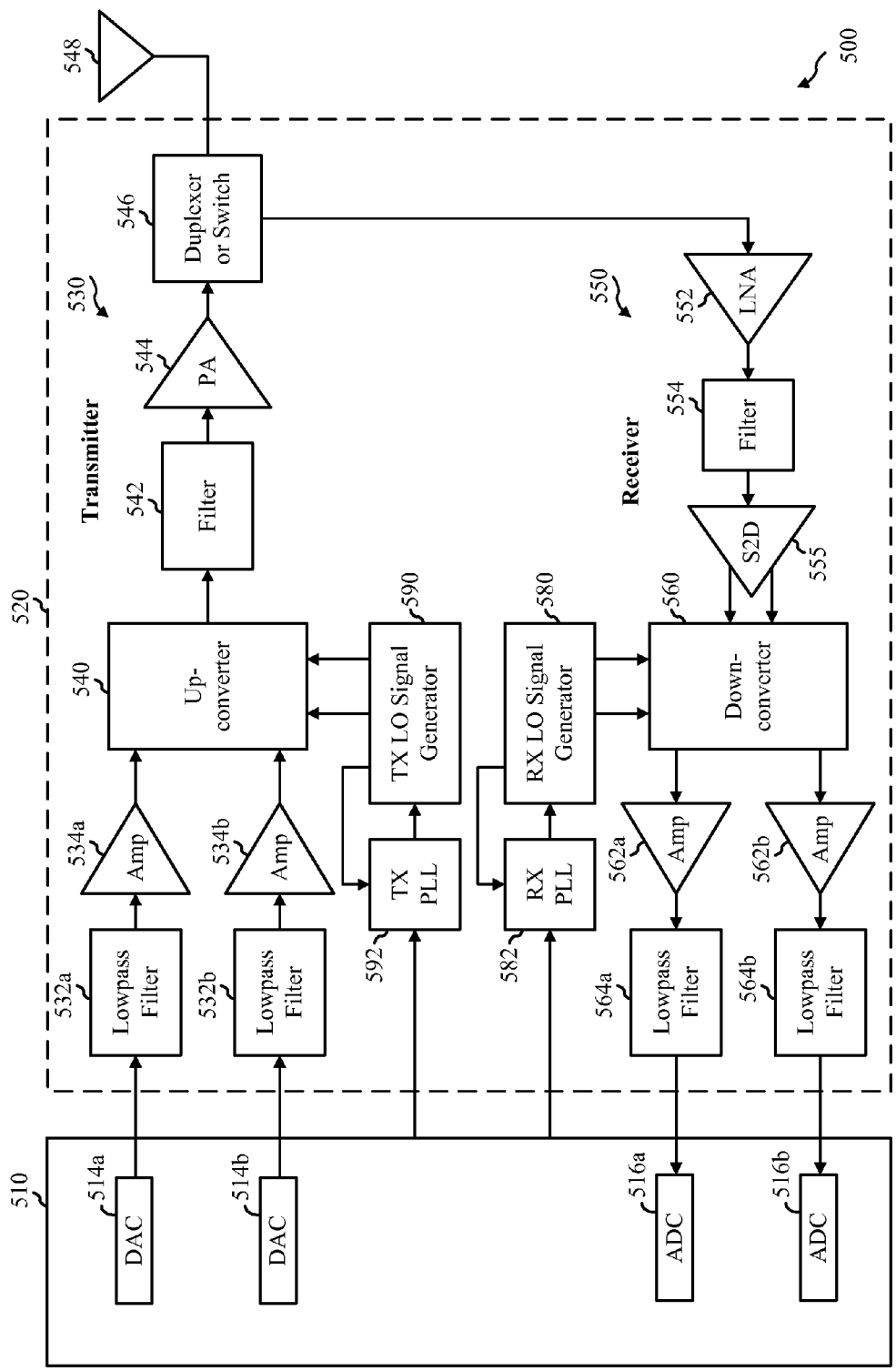
FIG. 5 illustrates a block diagram of a design of a wireless communication device in which the techniques of the present disclosure may be implemented.

FIG. 5 illustrates a block diagram of a design of a wireless communication device 500 in which the techniques of the present disclosure may be implemented. FIG. 5 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 5. Furthermore, other circuit blocks not shown in FIG. 5 may also be used to condition the signals in the transmitter and receiver. Some circuit blocks in FIG. 5 may also be omitted.

In the design shown in FIG. 5, wireless device 500 includes a transceiver 520 and a data processor 510. The data processor 510 may include a memory (not shown) to store data and program codes. Transceiver 520 includes a transmitter 530 and a receiver 550 that support bi-directional communication. In general, wireless device 500 may include any number of transmitters and any number of receivers for any number of communication systems and frequency bands. All or a portion of transceiver 520 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 5, transmitter 530 and receiver 550 are implemented with the direct-conversion architecture.

In the transmit path, data processor 510 processes data to be transmitted and provides I and Q analog output signals to transmitter 530. In the exemplary embodiment shown, the data processor 510 includes digital-to-analog-converters (DAC's) 514a and 514b for converting digital signals generated by the data processor 510 into the I and Q analog output signals.

Within transmitter 530, lowpass filters 532a and 532b filter the I and Q analog output signals, respectively, to remove undesired images caused by the prior digital-to-analog conversion. Amplifiers (Amp) 534a and 534b amplify the signals from lowpass filters 532a and 532b, respectively, and provide I and Q baseband signals. An upconverter 540 upconverts the I and Q baseband signals with I and Q transmit (TX) local oscillating (LO) signals from a TX LO signal generator 590 and provides an upconverted signal. A filter 542 filters the upconverted signal to remove undesired images caused by the frequency upconversion as well as noise in a receive frequency band. A power amplifier (PA) 544 amplifies the signal from filter 542 to obtain the desired output power level and provides a transmit RF signal. The transmit RF signal is routed through a duplexer or switch 546 and transmitted via an antenna 548.

In the receive path, antenna 548 receives signals transmitted by base stations and provides a received RF signal, which is routed through duplexer or switch 546 and provided to a low noise amplifier (LNA) 552. The received RF signal is amplified by LNA 552 and filtered by a filter 554 to obtain a desirable RF input signal. The desirable RF input signal is provided to a single-ended-to-differential converter 555 (S2D), which converts the signal into a differential voltage to input to a downconverter 560. In an exemplary embodiment, the S2D 555 may be designed according to the techniques of the present disclosure. The downconverter 560 downconverts the RF input signal with I and Q receive (RX) LO signals from an RX LO signal generator 580 and provides I and Q baseband signals. The I and Q baseband signals are amplified by amplifiers 562a and 562b and further filtered by lowpass filters 564a and 564b to obtain I and Q analog input signals, which are provided to data processor 510. In the exemplary embodiment shown, the data processor 510 includes analog-to-digital-converters (ADC's) 516a and 516b for converting the analog input signals into digital signals to be further processed by the data processor 510.

TX LO signal generator 590 generates the I and Q TX LO signals used for frequency upconversion. RX LO signal generator 580 generates the I and Q RX LO signals used for frequency downconversion. Each LO signal is a periodic signal with a particular fundamental frequency. A PLL 592 receives timing information from data processor 510 and generates a control signal used to adjust the frequency and/or phase of the TX LO signals from LO signal generator 590. Similarly, a PLL 582 receives timing information from data processor 510 and generates a control signal used to adjust the frequency and/or phase of the RX LO signals from LO signal generator 580.

Figure 6:
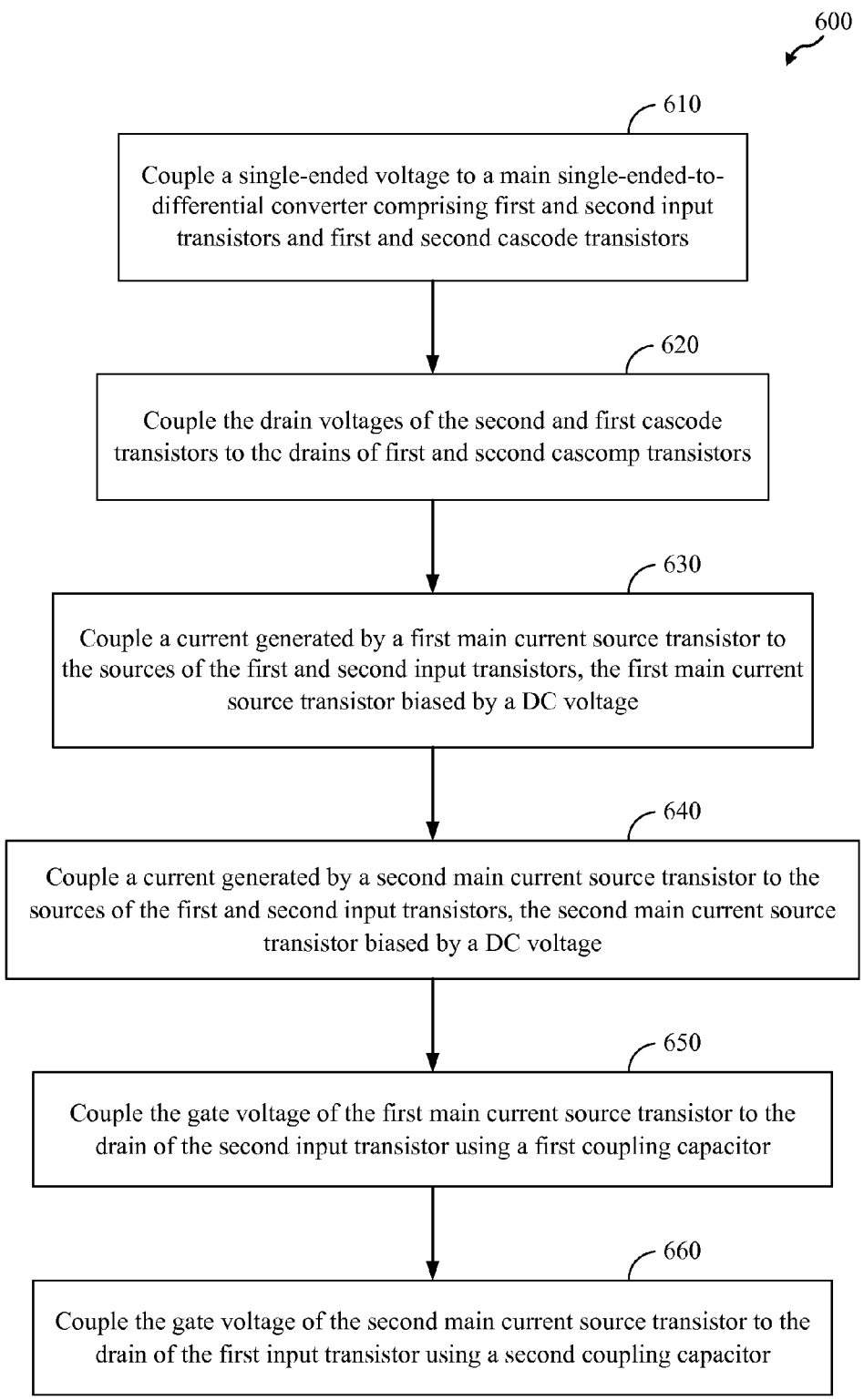
FIG. 6 illustrates an exemplary embodiment of a method according to the present disclosure.

FIG. 6 illustrates an exemplary embodiment of a method 600 according to the present disclosure. Note the method is shown for illustrative purposes only, and is not meant to limit the scope of the present disclosure.

In FIG. 6, at block 610, a single-ended voltage is coupled to a main single-ended-to-differential converter comprising first and second input transistors and first and second cascode transistors. In an exemplary embodiment, the gate of the first input transistor is coupled to a single-ended voltage, the gate of the second input transistor is coupled to an AC ground voltage, the sources of the first and second input transistors are biased by a main current, the main single-ended-to-differential converter further comprises loading elements coupled to the drains of the first and second cascode transistors, and the drains of the cascode transistors are coupled to a differential output voltage.

At block 620, the drain voltages of the second and first cascode transistors are coupled to the drains of first and second cascomp transistors, respectively. In an exemplary embodiment, the gate of the first cascomp transistor is coupled to the single-ended voltage, the gate of the second cascomp transistor is coupled to an AC ground voltage, and the sources of the cascomp transistors are biased by an auxiliary current.

At block 630, a current generated by a first main current source transistor is coupled to the sources of the first and second input transistors. In an exemplary embodiment, the first main current source transistor is biased by a DC voltage.

At block 640, a current generated by a second main current source transistor is coupled to the sources of the first and second input transistors. In an exemplary embodiment, the second main current source transistor is biased by a DC voltage.

At block 650, the gate voltage of the first main current source transistor is coupled to the drain of the second input transistor using a first coupling capacitor.

At block 660, the gate voltage of the second main current source transistor is coupled to the drain of the first input transistor using a second coupling capacitor.

It will be appreciated that while exemplary embodiments of the present disclosure have been described wherein NMOS transistors are employed for, e.g., the input transistors, cascode transistors, and cascomp transistors, PMOS transistors may also be readily employed in alternative exemplary embodiments, with corresponding modifications made to the circuitry shown. Furthermore, one of ordinary skill in the art will appreciate that while exemplary embodiments of the present disclosure have been described with reference to MOS transistors (MOSFET's), the techniques of the present disclosure need not be limited to MOSFET-based designs, and may be readily applied to alternative exemplary embodiments (not shown) employing bipolar junction transistors (or BJT's) and/or other three-terminal transconductance devices. For example, in an exemplary embodiment (not shown), any of the comparators shown may utilize BJT's rather than MOSFET's, with the collectors, bases, and emitters of the BJT's coupled as shown for the drains, gates, and sources, respectively, of the MOSFET's. Alternatively, in BiCMOS processes, a combination of both CMOS and bipolar structures/devices may be employed to maximize the circuit performance. Furthermore, unless otherwise noted, in this specification and in the claims, the terms "drain," "gate," and "source" may encompass both the conventional meanings of those terms associated with MOSFET's, as well as the corresponding nodes of other three-terminal transconductance devices, such as BJT's, which correspondence will be evident to one of ordinary skill in the art of circuit design.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. An apparatus comprising a single-ended-to-differential converter comprising:
    first and second input transistors, the gate of the first input transistor coupled to a single-ended voltage, the gate of the second input transistor coupled to an alternating current (AC) ground voltage, the first and second input transistors being biased by a main current;
    first and second cascode transistors coupled to the drains of the first and second input transistors, respectively;
    loading elements coupled to the drains of the first and second cascode transistors, the drains of the cascode transistors being coupled to a differential output voltage; and
    first and second cascomp transistors, the drains of the first and second cascomp transistors coupled to the drains of the second and first cascode transistors, respectively, the gate of the first cascomp transistor coupled to the single-ended voltage, the gate of the second cascomp transistor coupled to the AC ground voltage, the cascomp transistors being biased by an auxiliary current.

2. The apparatus of claim 1, wherein the first and second cascomp transistors are biased in weak inversion, wherein the first and second input transistors are biased in moderate inversion.

3. The apparatus of claim 2, the first and second cascomp transistors biased with gate-to-source voltages of 0.4 V and having threshold voltages of 0.55 V, the first and second input transistors being biased with gate-to-source voltages of 0.6 V and having threshold voltages of 0.55V.

4. The apparatus of claim 1, the first and second cascomp transistors coupled to the single-ended voltage and the AC ground voltage using coupling capacitors.

5. The apparatus of claim 1, the single-ended-to-differential converter further comprising:
    a first main current source transistor, the drain of the first main current source transistor coupled to the sources of the first and second input transistors, the first main current source transistor biased by a direct current (DC) voltage;
    a second main current source transistor, the drain of the second main current source transistor coupled to the sources of the first and second input transistors, the second main current source transistor biased by the DC voltage;
    a first coupling capacitor coupling the gate of the first main current source transistor to the drain of the second input transistor; and
    a second coupling capacitor coupling the gate of the second main current source transistor to the drain of the first input transistor.

6. The apparatus of claim 1, the auxiliary current being generated by at least one auxiliary current source transistor.

7. The apparatus of claim 1, the main current being larger than the auxiliary current.

8. The apparatus of claim 1, the loading elements comprising transistors biased using a voltage to generate a common-mode output voltage at the drains of the cascode transistors.

9. The apparatus of claim 1, the loading elements comprising resistors.

10. The apparatus of claim 1, wherein the apparatus comprises a wireless communication device.

11. A method comprising:
    coupling a single-ended voltage to a main single-ended-to-differential converter comprising first and second input transistors and first and second cascode transistors, the gate of the first input transistor coupled to a single-ended voltage, the gate of the second input transistor coupled to an alternating current (AC) ground voltage, the sources of the first and second input transistors being biased by a main current, the main single-ended-to-differential converter further comprising loading elements coupled to the drains of the first and second cascode transistors, the drains of the cascode transistors being coupled to a differential output voltage; and
    coupling the drain voltages of the second and first cascode transistors to drains of first and second cascomp transistors, respectively, the gate of the first cascomp transistor coupled to the single-ended voltage, the gate of the second cascomp transistor coupled to the AC ground voltage, the sources of the cascomp transistors being biased by an auxiliary current.

12. The method of claim 11, further comprising biasing the first and second cascomp transistors in weak inversion, and biasing the first and second input transistors in moderate inversion.

13. The method of claim 12, further comprising biasing the first and second cascomp transistors with gate-to-source voltages of 0.4 V, the first and second cascomp transistors having threshold voltages of 0.55 V, and biasing the first and second input transistors with gate-to-source voltages of 0.6 V, the first and second input transistors having threshold voltages of 0.55 V.

14. The method of claim 11, further comprising coupling the first and second cascomp transistors to the single-ended voltage and the AC ground voltage using coupling capacitors.

15. The method of claim 11, further comprising:
coupling a current generated by a first main current source transistor to the sources of the first and second input transistors, the first main current source transistor biased by a direct current (DC) voltage;
coupling a current generated by a second main current source transistor to the sources of the first and second input transistors, the second main current source transistor biased by the DC voltage;
coupling the gate voltage of the first main current source transistor to the drain of the second input transistor using a first coupling capacitor; and
coupling the gate voltage of the second main current source transistor to the drain of the first input transistor using a second coupling capacitor.

16. The method of claim 11, further comprising generating the auxiliary current using at least one auxiliary current source transistor.

17. The method of claim 11, the main current being larger than the auxiliary current.

18. The method of claim 11, the loading elements comprising transistors biased using a voltage to generate a common-mode output voltage at the drains of the cascode transistors.

19. The method of claim 11, the loading elements comprising resistors.

20. An apparatus comprising a single-ended-to-differential converter comprising:
means for converting a single-ended voltage to a differential voltage using a main path, the main path including first and second cascode transistors and loading elements coupled to a drain of each of the first and second cascode transistors, the drain of each of the first and second cascode transistors being coupled to a differential output; and
means for cancelling an inter-modulation product generated by the main path with an inter-modulation product generated by an auxiliary path, the means for cancelling comprising cascomp transistors of the auxiliary path coupled to the first and second cascode transistors in the main path.

21. The apparatus of claim 20, further comprising means for adaptively biasing a current provided to the main path to improve the linearity single-ended-to-differential converter.

22. The apparatus of claim 20, wherein the main path further includes first and second input transistors, wherein a gate of the first input transistor is coupled to the single-ended voltage, wherein a gate of the second input transistor is coupled to an alternating current (AC) ground voltage, and wherein a source of each of the first input transistor and the second input transistor is biased by a main current.

23. A device for wireless communications, the device comprising at least one digital-to-analog converter (DAC) for converting a digital transmit (TX) signal to an analog TX signal, at least one baseband TX amplifier for amplifying the analog TX signal, a TX local oscillating (LO) signal generator, an upconverter coupled to the TX LO signal generator and the at least one baseband TX amplifier, a TX filter coupled to the output of the upconverter, a power amplifier (PA) coupled to the TX filter, a duplexer coupled to the output of the power amplifier, a low-noise amplifier (LNA) coupled to the duplexer, a filter coupled to the LNA, a single-ended-to-differential converter coupled to the filter, a receive (RX)LO signal generator, a downconverter coupled to the RX LO signal generator and a differential output of the single-ended-to-differential converter, at least one low-pass filter coupled to the output of the downconverter, at least one analog-to-digital converter (ADC) for converting the output of the low-pass filter into a digital signal, the single-ended-to-differential converter comprising:
first and second input transistors, the gate of the first input transistor coupled to a single-ended voltage, the gate of the second input transistor coupled to an alternating current (AC)ground voltage, the first and second input transistors being biased by a main current;
first and second cascode transistors coupled to the drains of the first and second input transistors, respectively;
loading elements coupled to the drains of the first and second cascode transistors, the drains of the cascode transistors being coupled to a differential output voltage; and
first and second cascomp transistors, the drains of the first and second cascomp transistors coupled to the drains of the second and first cascode transistors, respectively, the gate of the first cascomp transistor coupled to the single-ended voltage, the gate of the second cascomp transistor coupled to the AC ground voltage, the cascomp transistors being biased by an auxiliary current.

24. An apparatus comprising a single-ended-to-differential converter comprising:
a first input transistor and a second input transistor, wherein a gate of the first input transistor is coupled to receive a single-ended voltage, wherein a gate of the second input transistor is coupled to receive an alternating current (AC) ground voltage, and wherein the first input transistor and the second input transistor are configured to be biased by a main current;
a first cascode transistor coupled to a drain of the first input transistor and a second cascode transistor coupled to a drain of the second input transistor;
a first loading element coupled to a drain of the first cascode transistor and a second loading element coupled to a drain of the second cascode transistor, wherein the drain of the first cascode transistor is coupled to a first output of a differential output and the drain of the second cascode transistor is coupled to a second output of the differential output; and
a first cascomp transistor and a second cascomp transistor, wherein a drain of the first cascomp transistor is coupled to the drain of the second cascode transistor and a drain of the second cascomp transistor is coupled to the drain of the first cascode transistor, wherein a gate of the first cascomp transistor is coupled to receive the single-ended voltage, wherein a gate of the second cascomp transistor is coupled to receive the AC ground voltage, and wherein the first cascomp transistor and the second cascomp transistor are configured to be biased by an auxiliary current.

* * * * *